(12) United States Patent
Shiraishi (10) Patent No.: US 6,843,572 B2
(45) Date of Patent: Jan. 18, 2005

(54) FORM-ERROR-CANCELLING MIRROR-SUPPORT DEVICES AND RELATED METHODS, AND MICROLITHOGRAPHY SYSTEMS COMPRISING SAME

(75) Inventor: Masayuki Shiraishi, Machida (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/359,945

(22) Filed: Feb. 6, 2003

(65) Prior Publication Data

US 2003/0147161 A1 Aug. 7, 2003

(30) Foreign Application Priority Data

Feb. 7, 2002 (JP) ........................................ 2002-030256

(51) Int. Cl.⁷ .............................................. G02B 7/182
(52) U.S. Cl. ...................... 359/846; 359/847; 359/848; 359/849; 359/896
(58) Field of Search ................................ 359/846–849, 359/220–224, 831, 896, 873, 822; 248/487; 250/201.9, 347

(56) References Cited

U.S. PATENT DOCUMENTS

| | | | | |
|---|---|---|---|---|
| 3,816,741 A | * | 6/1974 | Macall ........................ | 250/347 |
| 4,494,830 A | * | 1/1985 | Grainge et al. ............. | 359/896 |
| 4,540,251 A | * | 9/1985 | Yau et al. ................... | 359/846 |
| 4,640,591 A | * | 2/1987 | Cutburth ..................... | 359/876 |
| 4,681,408 A | * | 7/1987 | Ahmad et al. .............. | 359/848 |
| 4,763,991 A | * | 8/1988 | Klotz, Jr. .................... | 359/896 |
| 6,398,373 B1 | * | 6/2002 | Guzman et al. ............ | 359/846 |

OTHER PUBLICATIONS

U.S. patent application Ser. No. 10/128,963, Shiraishi, filed Apr. 23, 2002.

\* cited by examiner

Primary Examiner—Mohammad Sikder
(74) Attorney, Agent, or Firm—Klarquist Sparkman, LLP (57) ABSTRACT

Methods and apparatus are disclosed for peripherally supporting X-ray-reflective mirrors such as used in X-ray microlithography systems and other X-ray optical systems. The methods provide effective physical support while reducing certain deformations in the reflective surface of the mirror. An embodiment of the method or mirror-support apparatus utilizes multiple "pushing" and "pushing" devices that apply a compressive stress and tensile stress, respectively, to respective locations on the peripheral-side surface of the mirror. One or more pushing devices and one or more pulling devices can be used as required. For example, at time of mirror fabrication, respective pushing devices can be placed adjacent concave-deviation regions and respective pulling devices can be placed adjacent convex-deviation regions on the reflective surface of the mirror. (Each pushing device produces an offsetting convexity in the adjacent mirror material, and each pulling device produces a corresponding concavity in the adjacent mirror material.) Thus, form errors arising at fabrication time are offset while simultaneously supporting the mirror.

14 Claims, 3 Drawing Sheets

FORM-ERROR-CANCELLING MIRROR-SUPPORT DEVICES AND RELATED METHODS, AND MICROLITHOGRAPHY SYSTEMS COMPRISING SAME

FIELD

This disclosure pertains to X-ray optical systems and to X-ray microlithography systems comprising same. "X-ray" encompasses not only the usual "hard" X-ray wavelengths but also the so-called "soft-X-ray" (SXR) wavelengths (including the so-called "extreme ultraviolet" (EUV) wavelengths). Microlithography is a key technology utilized in the fabrication of microelectronic devices such as integrated circuits and displays. More specifically, the disclosure pertains to X-ray-reflective mirrors as used in such optical systems, and to methods and apparatus for supporting such mirrors in an optical system.

BACKGROUND

The following summary is set forth, by way of example, in the context of a "soft-X-ray" (SXR) microlithography system as an exemplary X-ray optical system.

As active circuit elements in microelectronic devices have become progressively smaller, the diffraction-limitations of current optical microlithography systems have become increasingly burdensome. Consequently, a large effort is in progress to develop a practical "next-generation" lithography (NGL) technology. An especially promising NGL approach is performed using an X-ray-wavelength beam as the lithographic energy beam. In this regard, SXR (EUV) microlithography systems are under active development, which utilize a wavelength (11–14 nm) that is approximately $\frac{1}{10}$ the shortest wavelength used in conventional optical microlithography. EUV lithography (EUVL) is capable of transferring fine patterns having elements as small as 70 to 30 nm. In any event, since a much shorter wavelength is used for the lithographic energy beam, substantially improved resolution of pattern elements is possible.

For X-ray wavelengths including EUV wavelengths, the refractive index is very close to unity for all known materials that have been considered for use in making refractive lenses for such wavelengths. Also, the reflectivity of X-radiation from most known materials is very low. Thus, it currently is impossible to construct X-ray optical systems employing conventional refractive and reflective optical elements. However, certain types of mirrors have been developed that exhibit rather high reflectivity to incident X-radiation. These mirrors, called "multilayer-coated" mirrors, have a surficial multilayer coating that reflects incident X-radiation based on constructive optical interference. Specifically, multiple layers of two respective materials (exhibiting different refractive indices and being high-Z and low-Z materials, respectively) are laminated to the surface of a mirror substrate in an alternating manner. The total number of each type of layer normally is several tens to several hundreds of layers. The multilayer coating presents weakly reflective interfaces between each pair of layers, and the respective thicknesses of the layers are configured to provide constructive interference of the reflected radiation from the various interfaces to yield a high net reflectivity of incident radiation. Hence, the multilayer coating is termed an interference coating. X-ray optical systems, notably projection-optical systems, as used in EUV microlithography systems typically comprise multiple multilayer-coated mirrors.

These reflective-optical systems are also termed diffraction-limited optical systems. Unless each multilayer-coated mirror of the system produces a sufficiently small wavefront error of reflected light, obtaining a desired optical performance consistent with target design rules is impossible. A standard parameter used for denoting the permissible wavefront error is the wavefront-error root-mean-square (RMS) value, which normally is one-fourteenth of the wavelength of the lithographic energy beam. A condition of $\lambda/14$ corresponds to a Strehl ratio (the ratio of the peak field amplitude in the focus of an optical element to the diffraction-limited amplitude) of 80% or greater. Projection-optical systems used in actual EUV microlithography systems typically are manufactured to have an even lower wavefront error than $\lambda/14$.

The typical wavelength of the energy beam used in EUVL is approximately 13 nm. At such a wavelength the wavefront error (WFE) RMS is 1 nm or less. If "m" denotes the number of mirrors used in the optical system, then the permissible form error (FE) for each mirror of the system is expressed by:

$$FE = WFE/2/(m)^{1/2} \cdot (RMS)$$

The reason that WFE is divided by two is that both the incident light and the reflected light are affected by form error. Consequently, the permissible form error (FE) for each mirror in a diffraction-limited optical system is obtained from the wavelength $\lambda$ and m as follows:

$$FE = \lambda/28/(m)^{1/2} \cdot (RMS)$$

For example, with $\lambda=13$ nm and m=6 mirrors, the permissible form error for a single mirror is 0.19 nm (RMS). This value is extremely small. It is extremely difficult to manufacture a multilayer-coated mirror (especially an aspherical mirror) having this precision. It also is extremely difficult to avoid mirror-surface deformations that arise from mounting the mirrors in an optical column. Furthermore, no matter how high the precision with which a mirror is fabricated, the profile of the reflective surface of the mirror is never ideal; it always has some residual form error. Mounting the mirrors to, for example, a rigid metal frame can cause significant changes to the respective profiles of the reflective surfaces, resulting in a larger than expected form error for the overall system.

Conventionally, multilayer-coated mirrors are supported using multiple identical support devices situated at respective locations around the circumference of each mirror. The respective points of contact of a support device with the mirror normally are spaced equi-angularly around the circumference of the mirror. The most common scheme is to use three support devices that hold the mirror by local application of compressive pressure to respective points located at 120° intervals about the center of the mirror. Since the same compressive force is applied to the mirror side at each contact point by the respective support devices, local deformation (due to the limited elasticity of the mirror substrate) of the reflective surface can arise in the vicinity of one or more of the contact points, resulting in a degradation of the optical performance of the mirror. Other mirror form errors can arise during fabrication of the mirror, but fabrication-related form errors tend not to occur with regularity or predictability. Rather, fabrication-related form errors tend to differ from mirror to mirror. Whenever identical support devices are used to support each of such mirrors having different form errors, reflective-surface form errors can arise that are non-uniform around each mirror.

In addition, whereas changes in the reflective-surface curvature of mirrors and other rotationally symmetrical elements can be eliminated by performing optical-system adjustments, non-rotationally symmetrical and/or non-uniform deformations cannot be eliminated by making optical-system adjustments.

As discussed above, the profile of the reflective surface of a multilayer-coated mirror can change after the mirror is mounted in an optical column. The change can arise either from non-uniform form errors occurring on the reflective surface during mirror fabrication and/or from non-uniform deformations arising from the application of non-uniform forces in the circumferential direction to the mirror as the mirror is being supported by a rigid frame in the optical column. Whenever microlithography is performed using an optical system comprising one or more such compromised mirrors, the accuracy and precision of pattern transfer is adversely affected.

SUMMARY

In view of the shortcomings of conventionally mounted mirrors as summarized above, the invention provides, inter alia, methods and devices for supporting a mirror, in an X-ray optical system, in a manner that reduces non-uniform deformations of the reflective surface of the mirror and thereby enhances the optical performance of the optical system.

According to a first aspect of the invention, methods are provided for supporting a reflective mirror relative to a mounting structure. An embodiment of such a method comprises the step of contacting a mirror-side surface of the mirror with at least three mirror-support devices selected from the group consisting of pulling devices and pushing devices. The at least three mirror-support devices contacting the mirror-side surface include at least one pushing device and at least one pulling device. The method also includes the step of positioning the mirror-support devices, between the mirror-side surface and the mounting structure, relative to each other and peripherally to the mirror so as to contact the mounting structure and to hold the mirror relative to the mounting structure. The method also includes the step of allowing at least one of the pushing devices to exert a respective compressive stress to a respective first location on the mirror-side surface relative to the mounting structure, and at least one of the pulling devices to exert a respective tensile stress on a respective second location on the mirror-side surface relative to the mounting structure.

The first location can be situated adjacent a region on the reflective surface of the mirror exhibiting a form error manifest as a concave-deviation region of the reflective surface. A "concave-deviation region" is a region on the reflective surface that is slightly thinner, due to form error, than it should be according to the ideal profile of the reflective surface. In other words, in the concave-deviation region, the reflective surface is slightly closer to the rear surface of the mirror than it should be according to the ideal profile. Similarly, the second location can be situated adjacent a region on the mirror exhibiting a form error manifest as a convex-deviation region of the reflective surface. A "convex-deviation region" is a region on the reflective surface that is thicker, due to form error, than it should be according to the ideal profile of the reflective surface. In other words, in the convex-deviation region, the reflective surface is slightly farther away from the rear surface of the mirror than it should be according to the ideal profile.

The contacting step can comprise contacting the mirror-side surface with multiple pushing devices and multiple pulling devices. For example, the contacting step can comprise contacting the mirror-side surface with at least three of the pushing devices or of the pulling devices.

According to another aspect of the invention, methods are provided, in the context of an X-ray optical system comprising at least one X-ray-reflective mirror mounted to a mounting structure in an optical column, for reducing a form error of the mirror. An embodiment of such a method comprises measuring (e.g., by interferometry) a profile of a reflective surface of the mirror so as to determine a region on the reflective surface exhibiting a respective form error. In a subsequent step a mirror-side surface of the mirror is contacted with at least three mirror-support devices selected from the group consisting of pushing devices and pulling devices, wherein the at least three mirror-support devices contacting the mirror-side surface include at least one pushing device and at least one pulling device. The mirror-support devices are positioned, between the mirror-side surface and the mounting structure, relative to each other and peripherally to the mirror so as: (a) to contact the mounting structure and to hold the mirror relative to the mounting structure, and (b) on a respective first location on the mirror-side surface adjacent the region exhibiting the form error, to apply a respective compressive or tensile stress to the location using a respective mirror-support device. The stress is of a magnitude and direction sufficient to cancel at least a portion of the form error in the adjacent region.

The first location can be situated adjacent a concave-deviation region on the reflective surface, wherein the applied stress is a compressive stress applied by a respective pushing device.

The method further can include the step, on a respective second location on the mirror-side surface situated adjacent a respective convex-deviation region of the reflective surface, of applying a tensile stress to the second location using a respective pulling device.

The contacting step can comprise contacting the mirror-side surface with multiple pushing devices and multiple pulling devices. For example, the mirror-side surface can be contacted with at least three of the pushing devices or of the pulling devices.

According to yet another aspect of the invention, mirror-support apparatus are provided for a reflective mirror. An embodiment of such an apparatus comprises a mirror-mounting structure a mirror-mounting structure and at least three mirror-support devices selected from the group consisting of pushing devices and pulling devices. The at least three mirror-support devices include at least one pushing device and at least one pulling device. The mirror-support devices are positioned, between the mirror-side surface and the mounting structure, relative to each other and peripherally to the mirror so as: (a) to contact the mirror-mounting structure and to hold the mirror relative to the mounting structure, and (b) on a first location on the mirror-side surface adjacent an area of the mirror exhibiting a form error, to apply a respective compressive or tensile stress to the location using one of the pushing and pulling devices, respectively. The stress is of a magnitude and direction sufficient to cancel at least a portion of the form error in the adjacent area. The first location can be situated adjacent a concave-deviation region on the reflective surface, wherein the applied stress is a compressive stress applied by a respective pushing device. The mirror-support devices further can be positioned, between the mirror-side surface and the mirror-mounting structure, so as, on a respective second location on the mirror-side surface adjacent a convex-deviation region on the reflective surface, to apply a tensile stress to the second location using a respective pulling device.

The apparatus further can comprise multiple pushing devices and multiple pulling devices, e.g., at least three of the pushing devices or of the pulling devices, or at least three of each of the pushing devices and the pulling devices.

The mounting structure can be configured as a frame in surrounding relationship to the mirror around the mirror-side surface.

According to yet another aspect of the invention, mirrors in combination with respective mirror-support apparatus, as summarized above, are provided. An embodiment of such a mirror can be an X-ray-reflective mirror, e.g., a multilayer-coated mirror.

According to yet another aspect of the invention, X-ray optical systems are provided. An embodiment of such a system comprises an X-ray-reflective mirror having a mirror-side surface and a reflective surface, and a mirror-support apparatus for the mirror. The mirror-support apparatus can be any of the configurations summarized above.

According to yet another aspect of the invention, microlithography systems are provided. An embodiment of such a system comprises a source, an illumination-optical system, and a projection-optical system. The source produces a lithography energy beam serving as an illumination beam. The illumination-optical system is situated downstream of the source and is configured to direct the illumination beam from the source to a pattern-defining reticle, thereby forming a patterned beam propagating downstream of the reticle and carrying an aerial image of a pattern portion illuminated by the illumination beam. The projection-optical system is situated downstream of the reticle and is configured to direct the patterned beam from the reticle to a sensitized substrate. The system also includes an optical column supporting constituent optical elements of at least the projection-optical system. The optical elements comprise a reflective mirror and a mirror-support apparatus for supporting the mirror in the optical column. The mirror-support apparatus can have any of the configurations summarized above.

As summarized above, the mirror is supported by mirror-support devices contacting the mirror-side surface. Each mirror-support device applies either a pushing (compressive) or pulling (tensile) force locally to the mirror-side surface. Whenever a local compressive force is applied to the mirror-side surface, a protrusion occurs on the reflective surface of the mirror (usually adjacent the location at which the compressive force is applied). Similarly, whenever a local tensile force is applied to the mirror-side surface, a concavity occurs on the reflective surface of the mirror (usually adjacent the location at which the tensile force is applied). Form errors in the mirror arising during mirror fabrication and mirror deformation resulting from supporting the mirror generally range from few Å to several nm. These errors are very small, but nevertheless are significant especially whenever the mirror is used under extremely demanding performance conditions such as in an X-ray microlithography system. By applying, while supporting the mirror, simultaneously one or both compressive and tensile forces as required to respective locations on the mirror-side surface, various form errors (whether uniform or non-uniform) can be corrected.

The foregoing and additional features and advantages of the invention will be more readily apparent from the following detailed description, which proceeds with reference to the accompanying drawings.

DETAILED DESCRIPTION

Various aspects of the invention are discussed below in the context of representative embodiments that are not intended to be limiting in any way.

First reference is made to FIG. 5, which depicts a SXR (EUV) projection-microlithography system 201 including one or more reflective optical components mounted as described later below. The system 201 of FIG. 5 employs, as a lithographic energy beam, a beam of EUV light of $\lambda=13$ nm. The depicted system 201 is configured to perform microlithographic exposures in a step-and-scan manner.

The EUV beam is produced by a laser-plasma source 207 excited by a laser 203 situated at the most upstream end of the depicted system 201. The laser 203 generates laser light at a wavelength within the range of near-infrared to visible. For example, the laser 203 can be a YAG laser or an excimer laser. Laser light emitted from the laser 203 is condensed by a condensing optical system 205 and directed to the downstream laser-plasma source 207. Upon receiving the laser light, the laser-plasma source 207 generates SXR (EUV) radiation having a wavelength ($\lambda$) of approximately 13 nm with good efficiency.

A nozzle (not shown), disposed near a focal point of laser light from the condensing optical system 205, discharges xenon gas at the focal point such that the discharged xenon gas is irradiated with the laser light. The laser light heats the discharged xenon gas to a temperature sufficiently high to produce a plasma that emits photons of EUV light as the irradiated xenon atoms transition to a lower-potential state. Since EUV light has low transmittance in air, the optical path for EUV light propagating from the laser-plasma source 207 is contained in a vacuum chamber 209 normally evacuated to high vacuum. Since debris normally is produced in the vicinity of the nozzle discharging xenon gas, the vacuum chamber 209 desirably is separate from other chambers of the system.

A rotationally symmetrical parabolic mirror 211, coated with a Mo/Si multilayer coating, is disposed relative to the laser-plasma source 207 so as to receive EUV light radiating from the laser-plasma source 207 and to reflect the EUV light in a downstream direction as a collimated beam. The multilayer coating on the parabolic mirror 211 is configured to have high reflectivity for EUV light of which λ=approximately 13 nm.

The collimated beam passes through a visible-light-blocking filter 213 situated downstream of the parabolic mirror 211. By way of example, the filter 213 is made of Be, with a thickness of 0.15 nm. Of the EUV radiation reflected by the parabolic mirror 211, only the desired 13-nm wavelength of radiation passes through the filter 213. The filter 213 is contained in a vacuum chamber 215 evacuated to high vacuum.

An exposure chamber 233 is disposed downstream of the filter 213. The exposure chamber 233 contains an illumination-optical system 217 that comprises a condenser mirror and a fly-eye mirror (not shown, but well-understood in the art). The illumination-optical system 217 also is configured to trim the EUV beam (propagating from the filter 213) to have an arc-shaped or other desired-shape transverse profile. The shaped "illumination beam" is irradiated toward the left in the figure.

A circular, concave mirror 219 is situated so as to receive the illumination beam from the illumination-optical system 217. The concave mirror 219 has a parabolic reflective surface 219a and is mounted vertically in the vacuum chamber 213. The concave mirror 219 comprises, for example, a quartz mirror substrate of which the reflection surface is machined extremely accurately to the desired parabolic configuration. The reflection surface of the mirror substrate is coated with a Mo/Si multilayer coating so as to form the reflective surface 219a that is highly reflective to EUV radiation of which λ=13 nm. Alternatively, for other wavelengths in the range of 10–15 nm, the multilayer coating can be of a first substance such as Ru (ruthenium) or Rh (rhodium) and a second substance such as Si, Be (beryllium), or $B_4C$ (carbon tetraboride).

A bending mirror 221 is situated at an angle relative to the concave mirror 219 so as to receive the EUV beam from the concave mirror 219 and direct the beam at a low incidence angle to a reflective reticle 223. The reticle 223 is disposed horizontally so that its reflective surface faces downward in the figure. Thus, the beam of EUV radiation emitted from the illumination-optical system 217 is reflected and condensed by the concave mirror 219, bent by the bending mirror 221, and focused on the reflective surface of the reticle 223.

The reticle 223 includes a multilayer coating so as to be highly reflective to incident EUV light. A reticle pattern, corresponding to the pattern to be transferred to a substrate 229, is defined in an EUV-absorbing layer formed on the multilayer coating of the reticle 223, as discussed later below. The reticle 223 is mounted to a reticle stage 225 that moves the reticle 223 at least in the Y direction. The reticle 223 normally is too large to be illuminated entirely during a single exposure "shot" of the EUV beam. As a result of the movability of the reticle stage 225, successive regions of the reticle 223 can be irradiated sequentially so as to illuminate the pattern in a progressive manner with EUV light from the bending mirror 221.

A projection-optical system 227 and substrate (e.g., semiconductor wafer) 229 are disposed in that order downstream of the reticle 223. The projection-optical system 227 comprises multiple multilayer-coated reflective mirrors that collectively demagnify an aerial image of the illuminated portion of the pattern on the reticle 223. The demagnification normally is according to a predetermined "demagnification factor" (e.g., ¼). The projection-optical system 227 focuses an aerial image of the illuminated pattern portion onto the surface of the substrate 229. Meanwhile, the substrate 229 is mounted to a substrate stage 231 that is movable in the X, Y, and Z directions.

During a microlithographic exposure, EUV light from the illumination-optical system 217 irradiates the reflective surface of the reticle 223. Meanwhile, the reticle 223 and substrate 229 are moved by their respective stages 225, 231 in a synchronous manner relative to the projection-optical system 227. The stages 225, 231 move the reticle 223 and substrate 229, respectively, at a velocity ratio determined by the demagnification factor of the projection-optical system 227. Thus, the entire circuit pattern defined on the reticle 223 is transferred, in a step-and-scan manner, to one or more "die" or "chip" locations on the substrate 229. By way of example, each "die" or "chip" on the substrate 229 is a square having 25-mm sides. The pattern is thus "transferred" from the reticle 223 to the substrate at very high resolution (e.g., sufficient to resolve a 0.07-$\mu$m line-and-space (L/S) pattern). So as to be imprintable with the projected pattern, the upstream-facing surface of the substrate 229 is coated with a suitable "resist."

In the system 201 of FIG. 5 at least one multilayer-coated mirror, mounted as described below, is included in at least one of the illumination-optical system 217, the reticle 223, and the projection-optical system 227.

First, general discussion of the manner in which a mirror, mounted using lateral support members applying radially inwardly directed ("pushing") pressure or radially outwardly directed ("pulling") pressure to the circumferential-side surface of the mirror, is set forth with reference to FIGS. 2(A)–2(B) and 3(A)–3(B), respectively.

As noted above, even when fabricated with high accuracy and precision, mirrors inevitably exhibit some degree of form error. Whenever a mirror is mounted to a fixed (e.g., metal) frame, further form changes can occur to the mirror. Conventional mirrors normally are supported on their side surfaces, either by pushing devices or pulling devices.

Figure 2A:
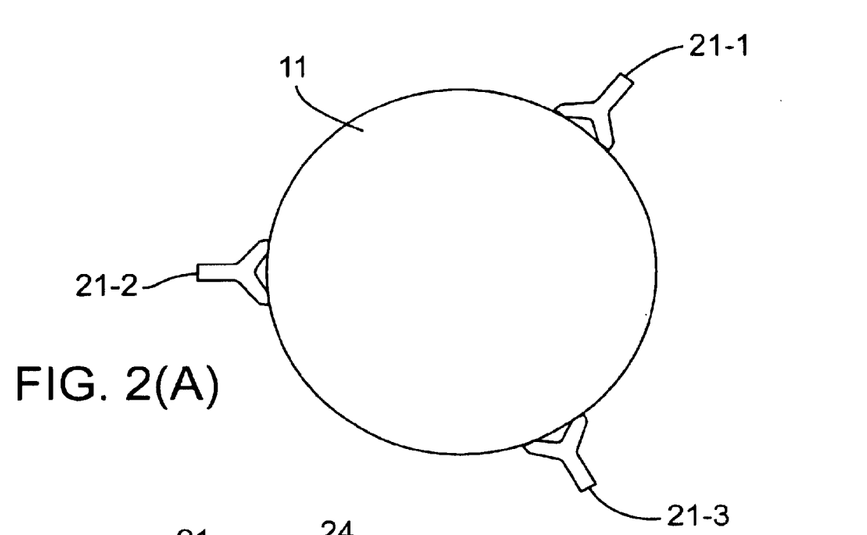
FIGS. 2(A)–2(B) are a plan view and elevational view, respectively, of multiple "pushing" devices being used to contact and support a mirror at respective locations around the circumference of the mirror.
Figure 2B:
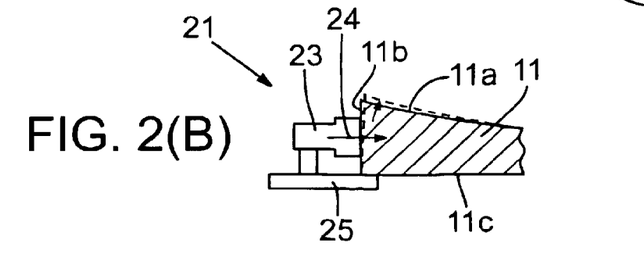

FIG. 2(A) depicts a mirror 11 being supported by three pushing devices 21 located at three respective support locations in this example. As shown in FIG. 2(B), each pushing device 21 includes a base 25, upon which rests a respective portion of the "rear" surface 11c of the mirror 11. Each pushing device 21 also includes a pushing member 23 that applies a lateral (compressive) force (arrow 24), oriented toward the center of the mirror, to the respective location on the mirror-side surface 11b. I.e., the direction of the compressive force is parallel to the base 25. The pushing devices 21 are located in the figure equi-angularly (120°) relative to each other and equi-radially relative to the center of the mirror 11. As a result of application of the compressive force to the side-surface 11b of the mirror, the region of the mirror in the vicinity of the stress exhibits a corresponding strain. The strain is greatest at the point of application of the stress and extends toward the center of the mirror, as depicted in FIG. 2(B) using dashed lines. As can be seen, the strain causes a respective thickening (convexity) of the mirror (FIG. 2(B)). The deformation to the reflective surface is represented as a slight "convex-deviation" in the reflective surface of the depicted mirror.

Figure 3A:
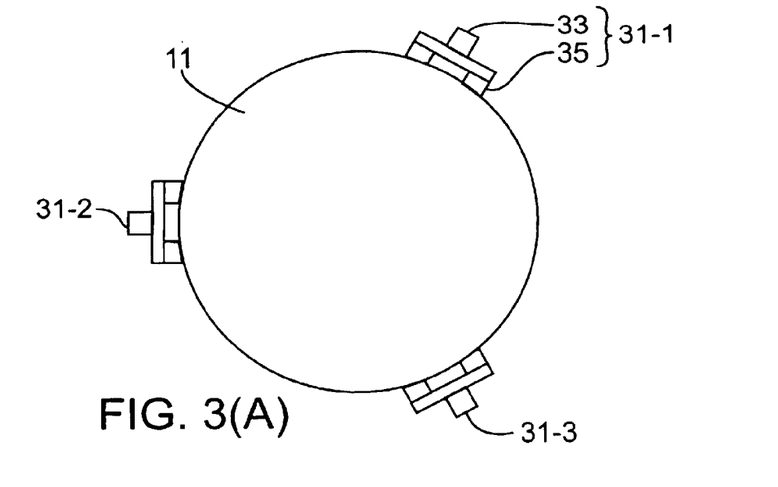
FIGS. 3(A)–3(B) are a plan view and elevational view, respectively, of multiple "pulling" devices being used to contact and support a mirror at respective locations around the circumference of the mirror.

Turning now to FIG. 3(A), the mirror 11 is shown being supported, at three locations on the side surface 11b of the mirror, by respective leaf-spring pulling devices 31. In FIG.

Figure 3B:
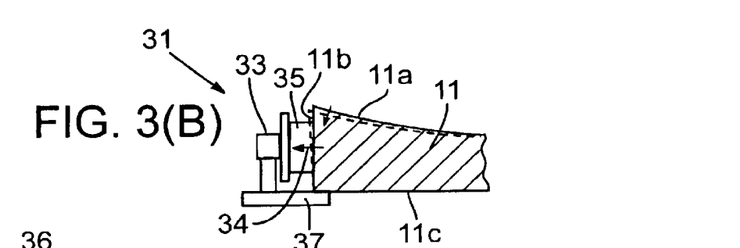

3(B), each pulling device 31 includes a base 37, upon which rests a respective portion of the "rear" surface 11c of the mirror 11. Each pulling device 31 includes a pulling member 33 that is attached to the mirror-side surface 11b by respective units 35 of adhesive material. Each pulling device 31 applies a lateral force (arrow 34), oriented radially away from the center of the mirror, to the respective location on the mirror side 11b. I.e., the direction of the tensile force is parallel to the base 37. The pulling devices 31 are located in the figure equi-angularly (120°) relative to each other and equi-radially relative to the center of the mirror 11. As a result of application of the tensile stress to the side-surface 11b of the mirror, the region of the mirror in the vicinity of the stress exhibits a corresponding strain. The strain is greatest at the point of application of the stress and extends radially away from the center of the mirror, as depicted in FIG. 3(B) using dashed lines. As can be seen, the strain causes a respective thinning (concavity) of the mirror in the stressed region (FIG. 3(B)). The deformation to the reflective surface 11a is represented as a slight "concave-deviation" in the reflective surface of the depicted mirror.

In each of the examples shown in FIGS. 2(A)–2(B) and 3(A)–3(B), the respective strains exhibited by the mirror surface 11a in response to the "push" (compressive stress) or "pull" (tensile stress) imparted to the mirror-side surface 11b by the respective mirror-support devices are all of the same type. I.e., the strains are in response only to compressive stress being applied to the mirror or only to tensile stress being applied to the mirror. Virtually all substances used for making a mirror 11 have respective Poisson ratios ($\sigma$) that are positive and greater than 0 and less than 1. The Poisson ratio $\sigma=\beta/\alpha$ is a ratio of transverse strain to axial strain exhibited by a body under axial compressive or tensile stress. The term $\beta$ is a ratio $\Delta d/d_0$ (change in thickness relative to initial (pre-strain) thickness), and the term is a ratio $\Delta L/L_0$ (change in length relative to initial (pre-strain) length). Every non-fluid substance exhibits a distinctive Poisson ratio. A positive Poisson ratio means that the substance tends to increase its transverse dimension when axially pushed and tends to decrease its transverse dimension when axially pulled.

Figure 1:
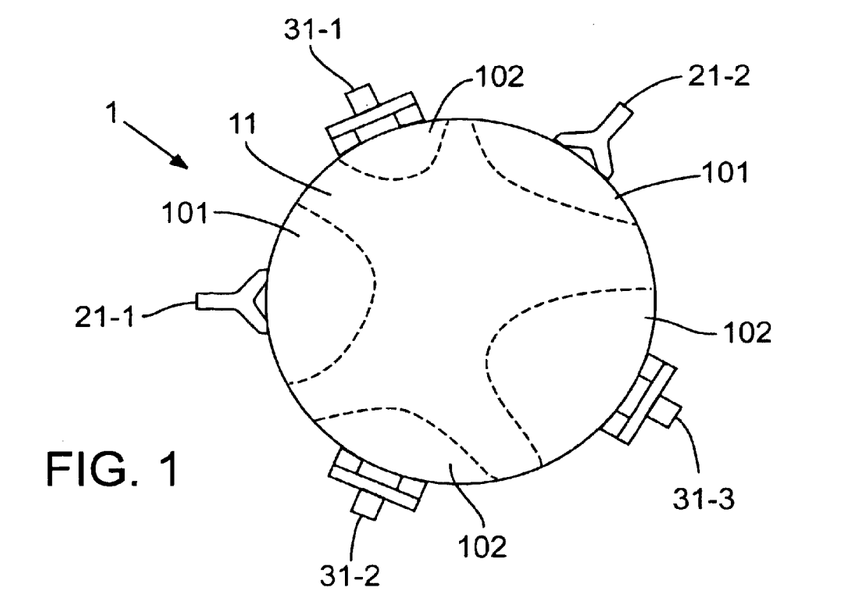
FIG. 1 generally depicts, in plan view, a first representative embodiment of a method for supporting a mirror, wherein "pushing" devices and "pushing" devices are placed strategically around the circumference of the mirror to support the mirror while correcting concave-deviation and convex-deviation form errors, respectively, in the reflective surface of the mirror.

A first representative embodiment of a mirror-support apparatus and method is depicted in FIG. 1, in which a mirror 11 is supported by an assembly 1 of multiple mirror-support devices, including two pushing devices 21-1, 21-2, and three pulling devices 31-1, 31-2, 31-3. The structure and function of each of the pushing devices 21 in FIG. 1 are the same as of the pushing devices 21 shown in FIGS. 2(A)–2(B), and the structure and function of each of the pulling devices 31 are the same as of the pulling devices 31 shown in FIGS. 3(A)–3(B). The pushing devices 21 and pulling devices 31 can be moved for placement at any location around the perimeter of the mirror 11 on a rigid (e.g., metal) frame (not shown). To such end, each of the pushing devices and pulling devices can include a respective actuator (not shown) for moving the respective device relative to the frame. More or fewer pushing devices 21 and pulling devices 31, relative to what is shown in FIG. 1, can be used as the situation indicates.

Prior to mounting the mirror 11 using the mirror-support devices 21, 31, the profile of the reflective surface of the mirror 11 is measured extremely accurately using, for example, a Fizeau interferometer or point-diffraction interferometer (PDI). For the sake of explanation, assume that the measured surface profile exhibits form errors that arose during mirror fabrication. In this example, the form errors are manifest as two areas 101 of 0.5-nm concave-deviation and three areas 102 of 0.5-nm convex-deviation on the reflective surface. A respective pushing device 21-1, 21-2 is placed at each concave-deviation region 101, and a respective pulling device 31-1, 31-2, 31-3 is placed at each convex-deviation region 102. Each pushing device 21 contacting the side surface of the mirror 11 applies a respective compressive force to the respective location on the mirror-side surface, which produces a corresponding strain manifest as a 0.5-nm convexity on the reflective surface of the mirror. These convexities offset the respective concave-deviation regions 101. Similarly, each pulling device 31 applying a respective tensile force to the side surface of the mirror 11 produces a corresponding strain manifest as a 0.5-nm concavity on the reflective surface of the mirror. These concavities offset the respective convex-deviation regions 102.

Hence, by supporting the mirror 11 using the support assembly 1 comprising strategically placed pushing devices 21 and pulling devices 31, a resultant substantially zero form error is observed in the regions on the mirror at which convex-deviation regions and concave-deviation regions previously were present. Thus, it is possible to support the mirror 11 on a mounting structure while eliminating form errors imparted at time of mirror fabrication.

Figure 4:
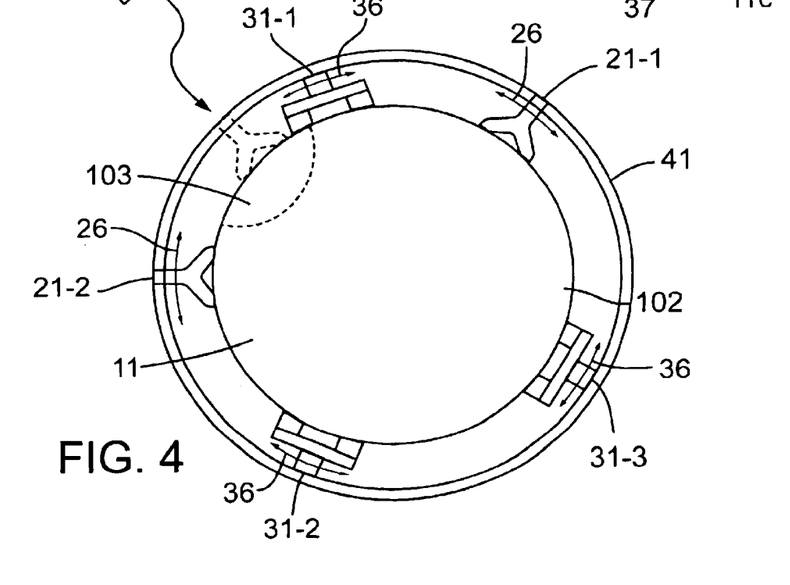
FIG. 4 generally depicts, in plan view, a first representative embodiment of a method for supporting a mirror, wherein "pushing" devices and "pushing" devices are placed strategically around the circumference of the mirror and between the mirror and a surrounding rigid frame, to support the mirror while correcting concave-deviation and convex-deviation form errors, respectively, in the reflective surface of the mirror.

A second representative embodiment of a method for supporting a mirror is shown in FIG. 4, in which the mirror 11 is supported by two pushing devices 21-1, 21-2 and by three pulling devices 31-1, 31-2, 31-3 that are movably mounted (arrows 26, 36) on a rigid (e.g., metal) frame 41 at any desired location around the perimeter of the mirror 11. The structure and function of the pushing devices 21 and pulling devices 31 are the same as of the pushing devices 21 and pulling devices 31 shown in FIGS. 2(A)–2(B) and 3(A)–3(B), respectively.

The respective positions of the pushing devices 21 and pulling devices 31 around the periphery of the mirror 11 may be determined in advance based on the results of profile measurements performed of the reflective surface of the mirror 11 after mirror fabrication. However, changes in mirror-surface profile also can arise after mounting the mirror 11 in the metal frame 41. Pre-mounting and/or post-mounting measurements desirably are measured interferometrically. The pushing devices 21 and pulling devices 31 may be placed at respective locations around the periphery of the mirror 11 for purposes of correcting surface-profile errors. For example, if an area 103 exhibits a concave-deviation form error, a pushing device 21-3 can be applied to the mirror side adjacent the area 103 to correct the deviation by locally generating a countervailing convexity-producing stress.

Figure 5:
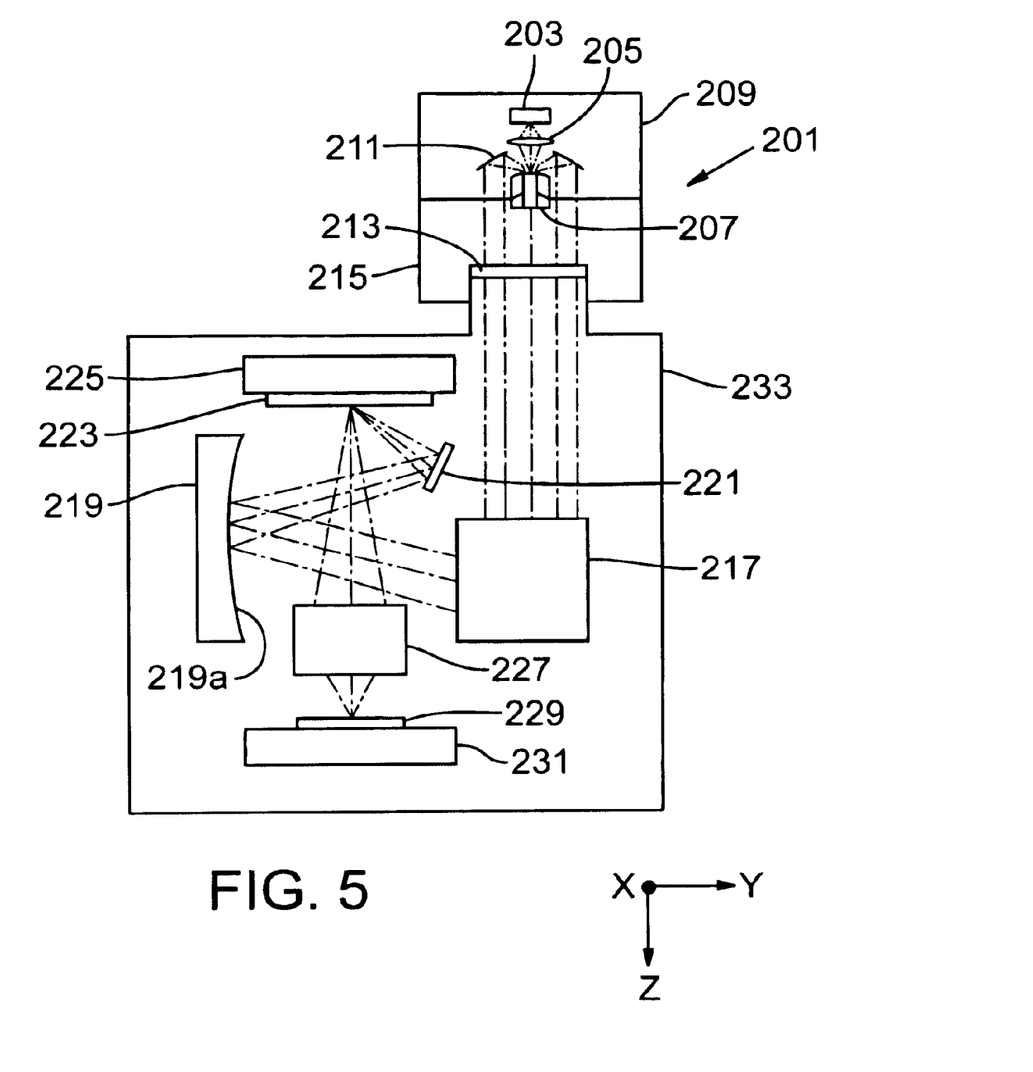
FIG. 5 is an elevational schematic diagram of an EUV microlithography system comprising at least one EUV-reflective mirror supported as disclosed herein.

Any of the various mirrors used in the microlithography system 201 shown in FIG. 5 can be mounted as described above. For example, the reflective mirror 219 is supported while simultaneously correcting a form error, on the reflective surface, that arose during fabrication of the mirror. Such corrections produce improved performance of the optical system in which the mirror is located, and thus improved lithographic performance of the microlithography system including the optical system. Each such mirror is mounted using both pulling devices and pushing devices that apply, while supporting the mirror, tensile and compression forces, respectively, to respective locations on the side of the mirror as required to produce countervailing concavities and convexities, respectively, to convex-deviation and concave-deviation regions, respectively.

Whereas the invention has been described in connection with multiple representative embodiments, the invention is not limited to those embodiments. On the contrary, the invention is intended to encompass all modifications, alternatives, and equivalents as may be encompassed by the invention, as defined by the appended claims.

What is claimed is:

1. A method for supporting a reflective mirror relative to a mounting structure, the method comprising:

contacting a mirror-side surface of the mirror with at least three mirror-support devices selected from the group consisting of pulling devices and pushing devices, wherein the at least three mirror-support devices contacting the mirror-side surface including at least one pushing device and at least one pulling device;

positioning the mirror-support devices, between the mirror-side surface and the mounting structure, relative to each other and peripherally to the mirror so as to contact the mounting structure and to hold the mirror relative to the mounting structure; and allowing at least one of the pushing devices to exert a respective compressive stress to a respective first location on the mirror-side surface relative to the mounting structure, and allowing at least one of the pulling devices to exert a respective tensile stress on a respective second location on the mirror-side surface relative to the mounting structure.

2. The method of claim 1, wherein:

the mirror has a reflective surface;

the first location is situated adjacent a region on the mirror exhibiting a form error manifest as a concave-deviation region of the reflective surface; and the second location is situated adjacent a region on the mirror exhibiting a form error manifest as a convex-deviation region of the reflective surface.

3. The method of claim 1, wherein the contacting step comprises contacting the mirror-side surface with multiple pushing devices and multiple pulling devices.

4. The method of claim 3, wherein the contacting step comprises contacting the mirror-side surface with at least three of the pushing devices or of the pulling devices.

5. A mirror-support apparatus for a reflective mirror having a mirror-side surface, the apparatus comprising:

a mirror-mounting structure; and at least three mirror-support devices selected from the group consisting of pushing devices and pulling devices, the at least three mirror-support devices including at least one pushing device and at least one pulling device, the mirror-support devices being positioned, between the mirror-side surface and the mounting structure, relative to each other and peripherally to the mirror so as (a) to contact the mirror-mounting structure and to hold the mirror relative to the mounting structure, and (b) on a first location on the mirror-side surface adjacent an area of the mirror exhibiting a form error, to apply a compressive or tensile stress to the location using one of the pushing and pulling devices, respectively, the stress being of a magnitude and direction sufficient to cancel at least a portion of the form error in the adjacent area.

6. The apparatus of claim 5, wherein:

the first location is situated adjacent a concave-deviation region on the reflective surface; and the applied stress is a compressive stress applied by a respective pushing device.

7. The apparatus of claim 5, wherein the mirror-support devices further are positioned, between the mirror-side surface and the mirror-mounting structure, so as, on a respective second location on the mirror-side surface adjacent a convex-deviation region on the reflective surface, to apply a tensile stress to the second location using a respective pulling device.

8. The apparatus of claim 5, further comprising multiple pushing devices and multiple pulling devices.

9. The apparatus of claim 8, further comprising at least three of the pushing devices or of the pulling devices.

10. The apparatus of claim 9, further comprising at least three of each of the pushing devices and the pulling devices.

11. The apparatus of claim 5, wherein the mounting structure is a frame in surrounding relationship to the mirror around the mirror-side surface.

12. In combination:

a mirror; and a mirror-support apparatus as recited in claim 5.

13. The combination of claim 12, wherein the mirror is an X-ray-reflective mirror.

14. The combination of claim 13, wherein the mirror is a multilayer-coated mirror.

* * * * *

UNITED STATES PATENT AND TRADEMARK OFFICE
CERTIFICATE OF CORRECTION

PATENT NO. : 6,843,572 B2
DATED : January 18, 2005
INVENTOR(S) : Shiraishi

It is certified that error appears in the above-identified patent and that said Letters Patent is hereby corrected as shown below:

<u>Title page</u>,
Item [57], ABSTRACT,
Line 7, ""pushing" and "pushing" devices" should be -- "pushing" and "pulling" devices --.

<u>Column 4</u>,
Lines 45-46, "a mirror-mounting structure a mirror-mounting structure" should be -- a mirror-mounting structure --.

<u>Column 6</u>,
Lines 4 and 20, ""pushing" devices and "pushing" devices" should be -- "pushing" devices and "pulling" devices --.

Signed and Sealed this

Twenty-fourth Day of May, 2005

JON W. DUDAS
*Director of the United States Patent and Trademark Office*